US012588558B2

(12) United States Patent
   Ko et al.

(10) Patent No.: US 12,588,558 B2
(45) Date of Patent: Mar. 24, 2026

(54) SEMICONDUCTOR PACKAGE

(71) Applicant: Samsung Electronics Co., Ltd.,
             Suwon-si (KR)

(72) Inventors: YeongBeom Ko, Suwon-si (KR);
             Junyun Kweon, Suwon-si (KR)

(73) Assignee: Samsung Electronics Co., Ltd.,
             Suwon-si (KR)

( * ) Notice:   Subject to any disclaimer, the term of this
             patent is extended or adjusted under 35
             U.S.C. 154(b) by 565 days.

(21) Appl. No.: 18/069,318

(22) Filed:     Dec. 21, 2022

(65)           Prior Publication Data

US 2023/0387088 A1      Nov. 30, 2023

(30)       Foreign Application Priority Data

May 25, 2022    (KR) ........................ 10-2022-0064141

(51) Int. Cl.
     *H01L 25/10*          (2006.01)
     *H01L 21/56*          (2006.01)
                 (Continued)
(52) U.S. Cl.
     CPC .......... *H01L 25/105* (2013.01); *H01L 21/561*
             (2013.01); *H01L 23/3107* (2013.01); *H01L*
                 *23/49811* (2013.01); *H01L 23/49816*
             (2013.01); *H01L 23/5383* (2013.01); *H01L*
                 *24/05* (2013.01); *H01L 24/14* (2013.01);
         *H01L 24/16* (2013.01); *H01L 24/32* (2013.01);
         *H01L 24/73* (2013.01); *H01L 24/94* (2013.01);
             *H01L 25/0657* (2013.01); *H01L 2224/0401*
         (2013.01); *H01L 2224/1403* (2013.01); *H01L*

*2224/16145* (2013.01); *H01L 2224/32225*
             (2013.01); *H01L 2224/73253* (2013.01); *H01L*
                                     *2224/94* (2013.01)
(58) Field of Classification Search
     CPC .................................................... H01L 25/105
     See application file for complete search history.

(56)                   References Cited

U.S. PATENT DOCUMENTS 7,772,683 B2    8/2010  Jang et al.
     8,664,757 B2    3/2014  Cho et al.
                       (Continued)

FOREIGN PATENT DOCUMENTS

KR            10-1817159 B1      2/2018
   KR        10-2020-0022214 A      3/2020
   KR        10-2022-0017022 A      2/2022

*Primary Examiner* — William A Harriston
(74) *Attorney, Agent, or Firm* — Fish & Richardson P.C.

(57)               ABSTRACT

A semiconductor package includes at least one semiconductor module on a substrate. The semiconductor module includes a first semiconductor chip having a first surface and a second surface opposite to the first surface, a second semiconductor chip on the first surface, a plurality of conductive pillars on the first surface, and a redistribution substrate on the second semiconductor chip and the plurality of conductive pillars. The redistribution substrate has a third surface and a fourth surface opposite to the third surface. The third surface of the redistribution substrate faces the first surface of the first semiconductor chip, the plurality of conductive pillars are electrically connected to the first surface of the first semiconductor chip and the third surface of the redistribution substrate, and the fourth surface of the redistribution substrate is electrically connected to the substrate of the semiconductor package.

19 Claims, 17 Drawing Sheets

(51) Int. Cl.

| | | |
|---|---|---|
| *H01L 23/00* | (2006.01) | |
| *H01L 23/31* | (2006.01) | |
| *H01L 23/498* | (2006.01) | |
| *H01L 23/538* | (2006.01) | |
| *H01L 25/065* | (2023.01) | |

(56) References Cited

U.S. PATENT DOCUMENTS

| | | | |
|---|---|---|---|
| 8,928,132 B2 | 1/2015 | Choi et al. | |
| 11,024,604 B2 | 6/2021 | Bowers et al. | |
| 11,133,290 B2 | 9/2021 | Zeng et al. | |
| 2006/0186525 A1* | 8/2006 | Theuss | H01L 23/3171 |
| | | | 257/E25.013 |
| 2009/0243068 A1* | 10/2009 | Kuan | H01L 25/0657 |
| | | | 438/109 |
| 2016/0133601 A1* | 5/2016 | Ko | H01L 23/49827 |
| | | | 257/738 |
| 2018/0374808 A1* | 12/2018 | Wu | H01L 25/18 |
| 2020/0212007 A1* | 7/2020 | Lou | H01L 25/0652 |
| 2020/0212012 A1* | 7/2020 | Meyers | H01L 23/13 |
| 2020/0235083 A1* | 7/2020 | Kwon | H01L 23/36 |
| 2020/0294927 A1* | 9/2020 | Wang | H01L 23/5389 |
| 2020/0411397 A1 | 12/2020 | Han et al. | |
| 2022/0037268 A1 | 2/2022 | Shen et al. | |
| 2022/0045010 A1 | 2/2022 | Shin et al. | |
| 2023/0387088 A1* | 11/2023 | Ko | H01L 21/561 |

* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2022-0064141, filed on May 25, 2022, in the Korean Intellectual Property Office, the entire contents of which are hereby incorporated by reference.

FIELD

Some example embodiments relate to a semiconductor package, including a stack-type semiconductor package.

BACKGROUND

A semiconductor package is configured to easily use an integrated-circuit chip as a part of an electronic product. In general, the semiconductor package includes a printed circuit board (PCB) and a semiconductor chip, which is mounted on the PCB and is electrically connected to the PCB by bonding wires or bumps. As the electronics industry advances, there is an increasing demand for electronic devices having small size, light weight, and multi-functional properties, and thus, various studies are conducted to develop a stack-type semiconductor package including a plurality of semiconductor chips stacked in one semiconductor package.

SUMMARY

An example embodiment of the inventive concepts provides a semiconductor package, in which a plurality of semiconductor chips are stacked in an easy and cost-effective manner.

According to an example embodiment of the inventive concepts, a semiconductor package includes at least one semiconductor module on a substrate. The semiconductor module includes a first semiconductor chip having a first surface and a second surface, the first surface opposite to the second surface, a second semiconductor chip on the first surface of the first semiconductor chip, the second semiconductor chip electrically connected to the first surface, a plurality of conductive pillars on the first surface of the first semiconductor chip, the plurality of conductive pillars horizontally spaced apart from the second semiconductor chip, and a redistribution substrate on the second semiconductor chip and the plurality of conductive pillars, the redistribution substrate having a third surface and a fourth surface, the third surface opposite to the fourth surface, the third surface of the redistribution substrate facing the first surface of the first semiconductor chip, the plurality of conductive pillars electrically connected to the first surface of the first semiconductor chip and the third surface of the redistribution substrate, and the fourth surface of the redistribution substrate electrically connected to the substrate of the semiconductor package.

According to an example embodiment of the inventive concepts, a semiconductor package includes a substrate, a first semiconductor module on the substrate, a bonding wire, and a second semiconductor module on the first semiconductor module. Each of the first and second semiconductor modules includes a first semiconductor chip having a first surface and a second surface, the first surface opposite to the second surface, a second semiconductor chip on the first surface of the first semiconductor chip, the second semiconductor chip electrically connected to the first surface, a plurality of conductive pillars on the first surface of the first semiconductor chip, the plurality of conductive pillars horizontally spaced apart from the second semiconductor chip, and a redistribution substrate on the second semiconductor chip and the plurality of conductive pillars, wherein the redistribution substrate has a third surface and a fourth surface, the third surface opposite to the fourth surface, the third surface of the redistribution substrate faces the first surface of the first semiconductor chip, the plurality of conductive pillars are electrically connected to the first surface of the first semiconductor chip and the third surface of the redistribution substrate, the first semiconductor module comprises solder balls on the fourth surface of the redistribution substrate, the fourth surface of the redistribution substrate faces the substrate of the semiconductor package, the first semiconductor module is electrically connected to the substrate through the solder balls, the second semiconductor module comprises a connection pad on the fourth surface of the redistribution substrate, the second surface of the first semiconductor chip faces the substrate of the semiconductor package, and the bonding wire electrically connects the connection pad of the second semiconductor module to the substrate of the semiconductor package.

According to an example embodiment of the inventive concepts, a method of fabricating a semiconductor package includes preparing a wafer including a plurality of first semiconductor chips, forming a plurality of conductive pillars on a top surface of the wafer, the conductive pillars electrically connected to the plurality of first semiconductor chips, mounting a plurality of second semiconductor chips on the wafer, forming a mold layer on the wafer to cover the second semiconductor chips, forming a redistribution substrate on a top surface of the mold layer and top surfaces of the conductive pillars, performing a sawing process on the wafer to form a plurality of semiconductor modules, and stacking the semiconductor modules on a substrate, the semiconductor modules electrically connected to the substrate.

BRIEF DESCRIPTION OF THE DRAWINGS

FIGS. 6, 7, 8, 9, 10, 11, 12, 13, 14 and 15 are sectional views illustrating a method of fabricating a semiconductor module, according to an example embodiment of the inventive concepts.

DETAILED DESCRIPTION

Figure 1:
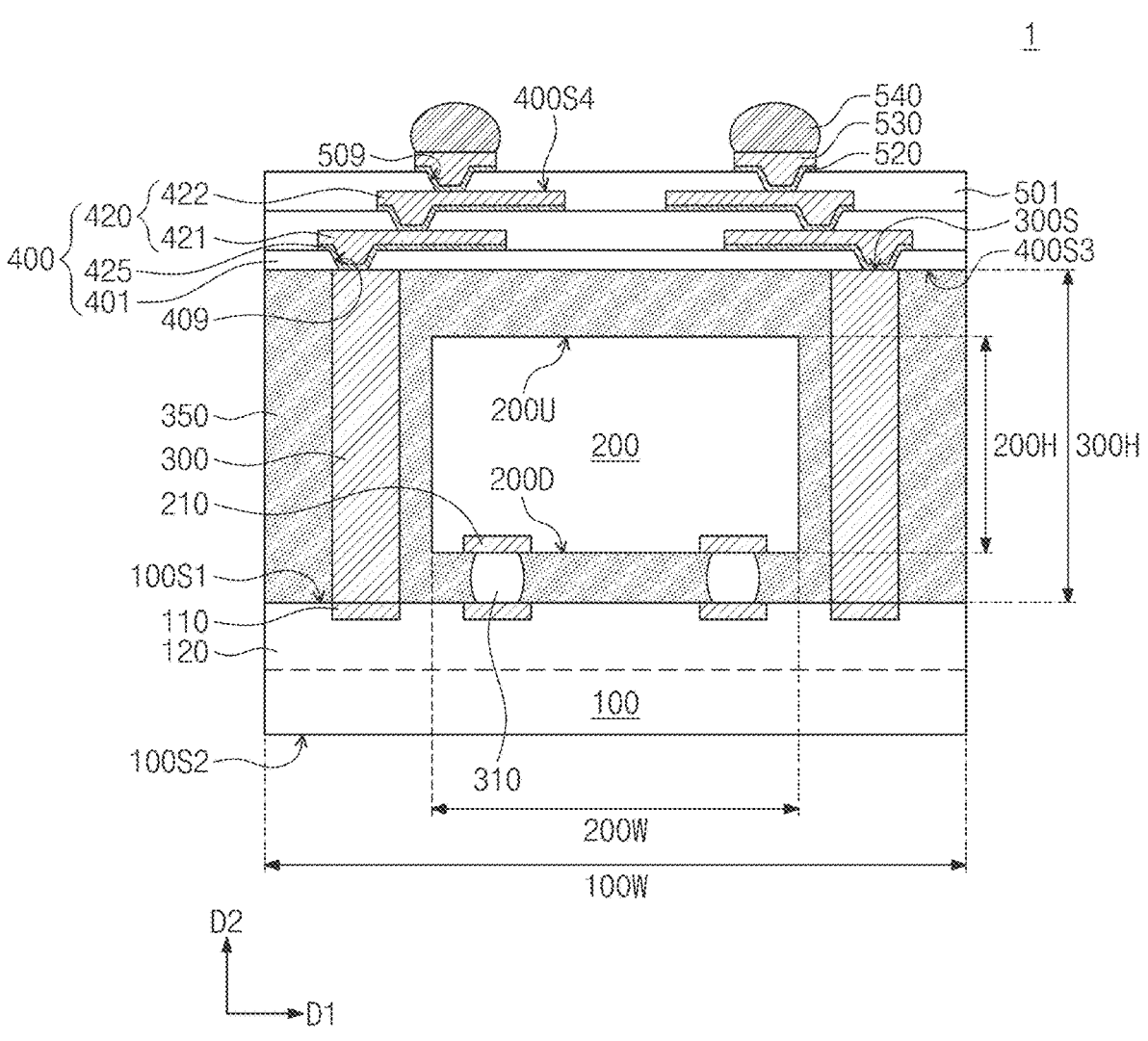
FIG. 1 is a sectional view illustrating a semiconductor module 1 according to an example embodiment of the inventive concepts.

Example embodiments of the inventive concepts will now be described more fully with reference to the accompanying drawings, in which example embodiments are shown.

Example embodiments of the inventive concepts may, however, be embodied in many different forms and should not be construed as being limited to the example embodiments set forth herein; rather, these example embodiments are provided so that this disclosure will be thorough, and will convey inventive concepts of example embodiments to those of ordinary skill in the art. In the drawings, the thicknesses of layers and regions are exaggerated for clarity. Like reference numerals in the drawings denote like elements, and thus their description will be omitted.

FIG. 1 is a sectional view illustrating a semiconductor module 1 according to an example embodiment of the inventive concepts.

Referring to FIG. 1, the semiconductor module 1 may include a first semiconductor chip 100, a second semiconductor chip 200, conductive pillars 300, a redistribution substrate 400, and solder balls 540.

The first semiconductor chip 100 may have a first surface 100S1 and a second surface 100S2, which are opposite to each other. The first semiconductor chip 100 may include first chip pads 110 and a first circuit layer 120. The first circuit layer 120 may be adjacent to the first surface 100S1. The first circuit layer 120 may include integrated circuits. The first chip pads 110 may be disposed on the first surface 100S1 of the first semiconductor chip 100. The first chip pads 110 may be formed of or include a conductive material. The first semiconductor chip 100 may be a logic chip or a memory chip. In an example embodiment, the first semiconductor chip 100 may be a logic chip. The logic chip may include an application specific integrated circuit (ASIC) chip and an application processor (AP) chip. The ASIC chip may include application specific integrated circuit (ASIC). In another example embodiment, the first semiconductor chip 100 may include a central processing unit (CPU) or a graphic processing unit (GPU). The memory chip may be a high bandwidth memory (HBM) chip.

The second semiconductor chip 200 may be disposed on the first semiconductor chip 100. The second semiconductor chip 200 may be disposed on the first surface 100S1 of the first semiconductor chip 100. The second semiconductor chip 200 may have a bottom surface 200D and a top surface 200U, which are opposite to each other. The bottom surface 200D of the second semiconductor chip 200 may be disposed to face the first surface 100S1 of the first semiconductor chip 100. The second semiconductor chip 200 may include integrated circuits and second chip pads 210. The integrated circuits may be adjacent to the bottom surface 200D of the second semiconductor chip 200. The second chip pads 210 may be disposed on the bottom surface 200D of the second semiconductor chip 200. The second chip pads 210 may be formed of or include a conductive material. The second semiconductor chip 200 may be a logic chip or a memory chip. In an example embodiment, the second semiconductor chip 200 may be a logic chip. The logic chip may include an application specific integrated circuit (ASIC) chip and an application processor (AP) chip. The ASIC chip may include application specific integrated circuit (ASIC). In another example embodiment, the second semiconductor chip 200 may include a central processing unit (CPU) or a graphic processing unit (GPU). The memory chip may be a high bandwidth memory (HBM) chip.

Connecting portions 310 may be disposed between the first semiconductor chip 100 and the second semiconductor chip 200. The connecting portions 310 may be respectively connected to corresponding ones of the first chip pads 110. The connecting portions 310 may be respectively connected to corresponding ones of the second chip pads 210 of the second semiconductor chip 200. The connecting portions 310 may be formed of or include a conductive material and may resemble at least one of solder ball, bump, and pillar in shape. The second semiconductor chip 200 may be electrically connected to the first semiconductor chip 100 through the second chip pads 210, the connecting portions 310, and corresponding ones of the first chip pads 110.

Each of the first and second semiconductor chips 100 and 200 may have a width in a first direction D1 that is parallel to the first surface 100S1 of the first semiconductor chip 100. A width 100W of the first semiconductor chip 100 may be larger than a width 200W of the second semiconductor chip 200.

A plurality of conductive pillars 300 may be disposed on the first semiconductor chip 100. The conductive pillars 300 may be disposed on the first surface 100S1 of the first semiconductor chip 100. The conductive pillars 300 may be horizontally spaced apart from each other in the first direction D1. The conductive pillars 300 may be horizontally spaced apart from the second semiconductor chip 200 in the first direction D1. Each of the conductive pillars 300 may be provided on the first surface 100S1 of the first semiconductor chip 100 and may be electrically connected to the first semiconductor chip 100. For example, the conductive pillars 300 may be respectively connected to corresponding ones of the first chip pads 110 of the first semiconductor chip 100. The conductive pillars 300 may be formed of or include at least one of metallic materials. In an example embodiment, the metallic material may include copper.

Each of the second semiconductor chip 200 and the conductive pillars 300 may have a height in a second direction D2 that is perpendicular to the first surface 100S1 of the first semiconductor chip 100. In an example embodiment, a height 300H of each of the conductive pillars 300 may be larger than a height 200H of the second semiconductor chip 200.

A mold layer 350 may be disposed on the first surface 100S1 of the first semiconductor chip 100. The mold layer 350 may cover top and side surfaces of the second semiconductor chip 200 and side surfaces of the conductive pillars 300. A side surface of the mold layer 350 may be aligned to a side surface of the redistribution substrate 400 and a side surface of the first semiconductor chip 100 in the second direction D2. The mold layer 350 may not cover the side surface of the redistribution substrate 400 and the side surface of the first semiconductor chip 100. The mold layer 350 may be extended into a space between the first and second semiconductor chips 100 and 200 to cover the connecting portions 310. The mold layer 350 may be provided to fill a space between the first surface 100S1 of the first semiconductor chip 100 and the bottom surface 200D of the second semiconductor chip 200. A top surface 300S of each of the conductive pillars 300 may not be covered with the mold layer 350 and may be exposed to the outside of the mold layer 350. A top surface of the mold layer 350 may be located at substantially the same level as the top surfaces 300S of the conductive pillars 300. The mold layer 350 may be formed of or include an insulating material (e.g., epoxy-based molding compound).

The redistribution substrate 400 may be disposed on the second semiconductor chip 200, the conductive pillars 300, and the mold layer 350. The redistribution substrate 400 may have a third surface 400S3 and a fourth surface 400S4, which are opposite to each other. The third surface 400S3 of the redistribution substrate 400 may face the first surface 100S1 of the first semiconductor chip 100. The third surface 400S3 of the redistribution substrate 400 may be in direct and physical contact with the conductive pillars 300 and the mold layer 350. The conductive pillars 300 may be electrically connected to the third surface 400S3 of the redistribution substrate 400.

The redistribution substrate 400 may include an insulating layer 401, redistribution patterns 420, and seed patterns 425. The insulating layer 401 may be disposed on the mold layer 350 and the conductive pillars 300 to cover the top surface of the mold layer 350 and the top surface 300S of the conductive pillars 300. First openings 409 may be formed in the insulating layer 401 to expose the conductive pillars 300. The insulating layer 401 may be formed of or include at least one of organic materials (e.g., photoimageable dielectric (PID) materials). For example, the PID material may include at least one of photo-imageable polyimide, polybenzoxazole, phenol-based polymers, or benzocyclobutene-based polymers, but example embodiments are not limited thereto. In an example embodiment, a plurality of the insulating layers 401 may be provided. The number of the stacked insulating layers 401 may be variously changed. For example, the insulating layers 401 may be formed of or include the same or substantially the same material. In some example embodiments, there may be no observable interface between adjacent ones of the insulating layers 401. A top surface of the redistribution substrate 400 may include a top surface of the uppermost one of the insulating layers 401.

The redistribution patterns 420 may be provided in the first openings 409. The redistribution patterns 420 may be disposed to be laterally spaced apart from each other and may be electrically separated from each other. Here, the expression "two elements are laterally spaced apart from each other" may mean that the elements are horizontally spaced apart from each other. The term "horizontal" may indicate a direction parallel to the top surface of the first semiconductor chip 100 or the first direction D1. The redistribution patterns 420 may be formed of or include at least one of metallic materials (e.g., copper). An expression "an element is electrically connected to the redistribution substrate 400" may mean that the element is electrically connected to at least one of the redistribution patterns 420.

Each of the redistribution patterns 420 may include a first via and a first line. The first via of each of the redistribution patterns 420 may be provided in a corresponding one of the insulating layers 401. The first line may be provided on a top surface of the first via and may be connected to the first via without any interface therebetween. A width of the first line may be larger than a width of a bottom surface of the first via. The first line may be extended to cover at least a portion of a top surface of a corresponding one of the insulating layers 401. In some example embodiments, the via may be an element for vertical interconnection, and the interconnection line may be an element for horizontal interconnection. Here, the term "vertical" may be used to represent a direction parallel to the second direction D2. In some example embodiments, a level of an element may mean a vertical position of the element, and a difference in level between elements may be a difference between the vertical positions of the elements measured in the second direction D2.

Each of the redistribution patterns 420 may include first sub-redistribution patterns 421 and second sub-redistribution patterns 422. A first via of each of the first sub-redistribution patterns 421 may be disposed on the top surface 300S of the conductive pillar 300. The second sub-redistribution patterns 422 may be disposed on top surfaces of the first sub-redistribution patterns 421 and may be coupled to the first sub-redistribution patterns 421.

The number of the stacked first redistribution patterns 420 may not be limited to the illustrated example embodiment and may be variously changed. For example, the first sub-redistribution patterns 421 may be omitted, and the second sub-redistribution patterns 422 may be disposed on the top surfaces 300S of the conductive pillars 300. Alternatively, third sub-redistribution patterns (not shown) may be further provided between first sub-redistribution patterns 121 and second sub-redistribution patterns 122.

The seed patterns 425 may be provided on bottom surfaces of the redistribution patterns 420, respectively. For example, each of the seed patterns 425 may cover bottom and side surfaces of the first via of a corresponding one of the first redistribution patterns 420 and a bottom surface of the first line thereof. Each of the seed patterns 425 may not be extended to a side surface of the first line of the corresponding one of the first redistribution patterns 420. The seed patterns 425 in the lowermost one of the insulating layers 401 may be interposed between the top surfaces 300S of the conductive pillars 300 and the first sub-redistribution patterns 421. The seed patterns 425 in the lowermost one of the insulating layers 401 may be in direct contact with the conductive pillars 300. The seed patterns 425 may be formed of or include a material different from the redistribution patterns 420. For example, the seed patterns 425 may be formed of or include a conductive seed material. The conductive seed material may include copper, titanium, and/or alloys, but example embodiments are not limited thereto. The seed patterns 425 may serve as barrier layers and may prevent a material, which is included in the redistribution patterns 420, from being diffused.

A protection layer 501 may be provided on top surfaces of the second sub-redistribution patterns 422 to cover the second sub-redistribution patterns 422 and the uppermost one of the insulating layers 401. The protection layer 501 may be formed of or include the same or substantially the same material as the insulating layer 401. In some example embodiments where the protection layer 501 and the uppermost one of the insulating layers 401 include the same or substantially the same material, there may be no observable interface between the protection layer 501 and the uppermost one of the insulating layers 401. Second openings 509 may be formed in the protection layer 501 to expose the second sub-redistribution patterns 422.

Under-bump patterns 530 may be disposed on the top surfaces of the second sub-redistribution patterns 422, respectively. The under-bump patterns 530 may be provided in the second openings 509. Thus, the under-bump patterns 530 may be electrically connected to the redistribution substrate 400.

Under-bump seed patterns 520 may be provided between the under-bump patterns 530 and the protection layer 501 and between the under-bump patterns 530 and the second sub-redistribution patterns 422. A thickness of the under-bump seed patterns 520 may be smaller than a thickness of the under-bump patterns 530. The under-bump seed patterns 520 may be formed of or include a conductive seed material. The under-bump seed patterns 520 may be formed of or include a material different from the under-bump patterns 530. For example, the under-bump seed patterns 520 may be formed of or include at least one of titanium or titanium-copper alloys. As another example, the under-bump seed patterns 520 may be formed of or include the same material as the under-bump patterns 530. In some example embodiments, there may be no observable interface between the under-bump seed patterns 520 and the under-bump patterns 530.

The solder balls 540 may be disposed on the fourth surface 400S4 of the redistribution substrate 400. The solder balls 540 may be disposed on and coupled to corresponding ones of the under-bump patterns 530. The solder balls 540 may be formed of or include a solder material. In an example embodiment, the solder material may include tin, bismuth, lead, silver, or alloys thereof.

Figure 2:
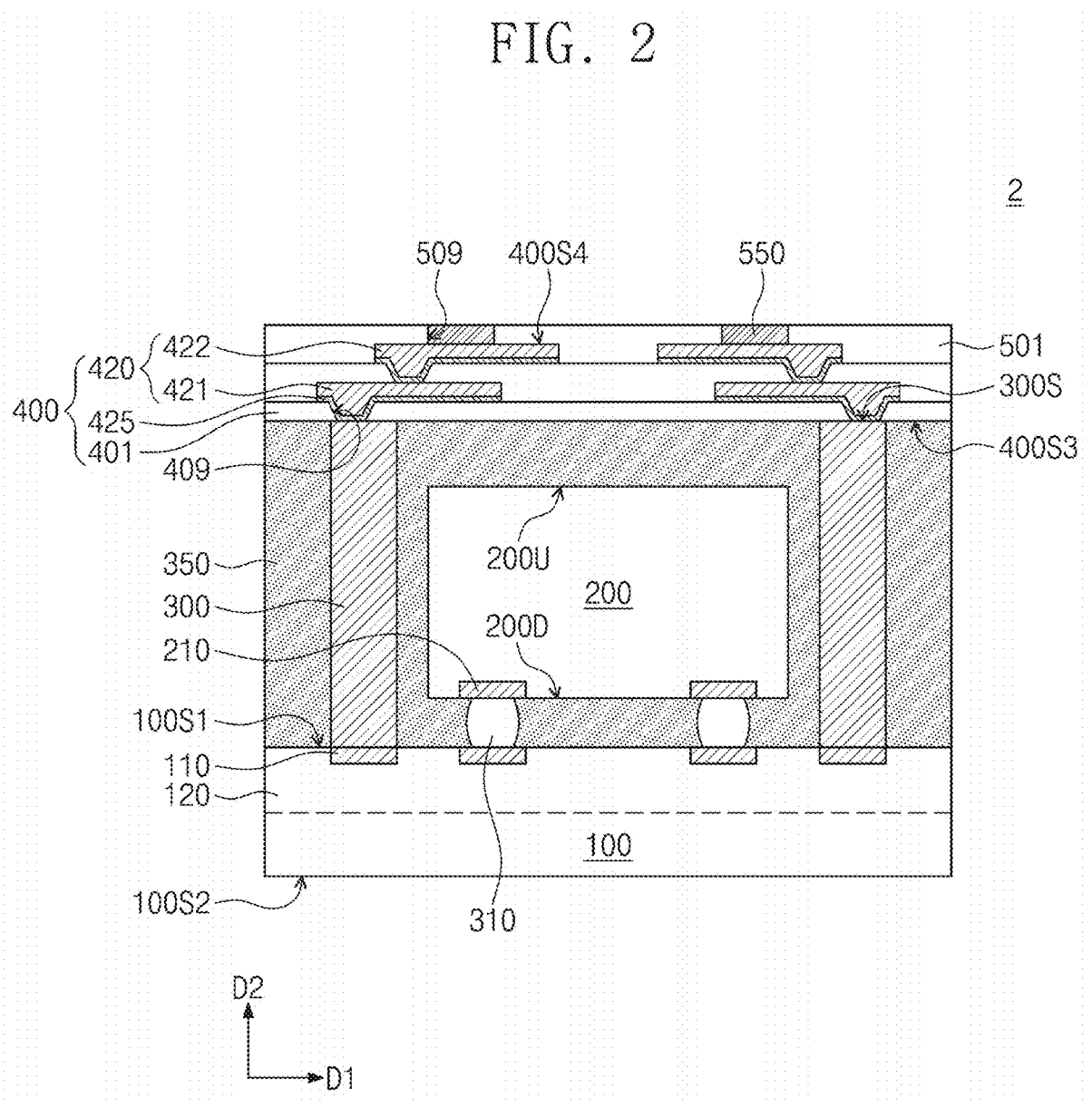
FIG. 2 is a sectional view illustrating a semiconductor module 2 according to an example embodiment of the inventive concepts.

FIG. 2 is a sectional view illustrating a semiconductor module 2 according to an example embodiment of the inventive concepts. For concise description, the description that follows will mainly refer to features different from those in the semiconductor module 1 described with reference to FIG. 1.

Referring to FIG. 2, the semiconductor module 2 may include the first semiconductor chip 100, the second semiconductor chip 200, the conductive pillars 300, the redistribution substrate 400, and connection pads 550. The connection pads 550 may be disposed on the fourth surface 400S4 of the redistribution substrate 400. The connection pads 550 may be provided in the second openings 509 and may be provided on top surfaces of the second sub-redistribution patterns 422. Accordingly, the connection pads 550 may be electrically connected to the redistribution substrate 400.

Figure 3:
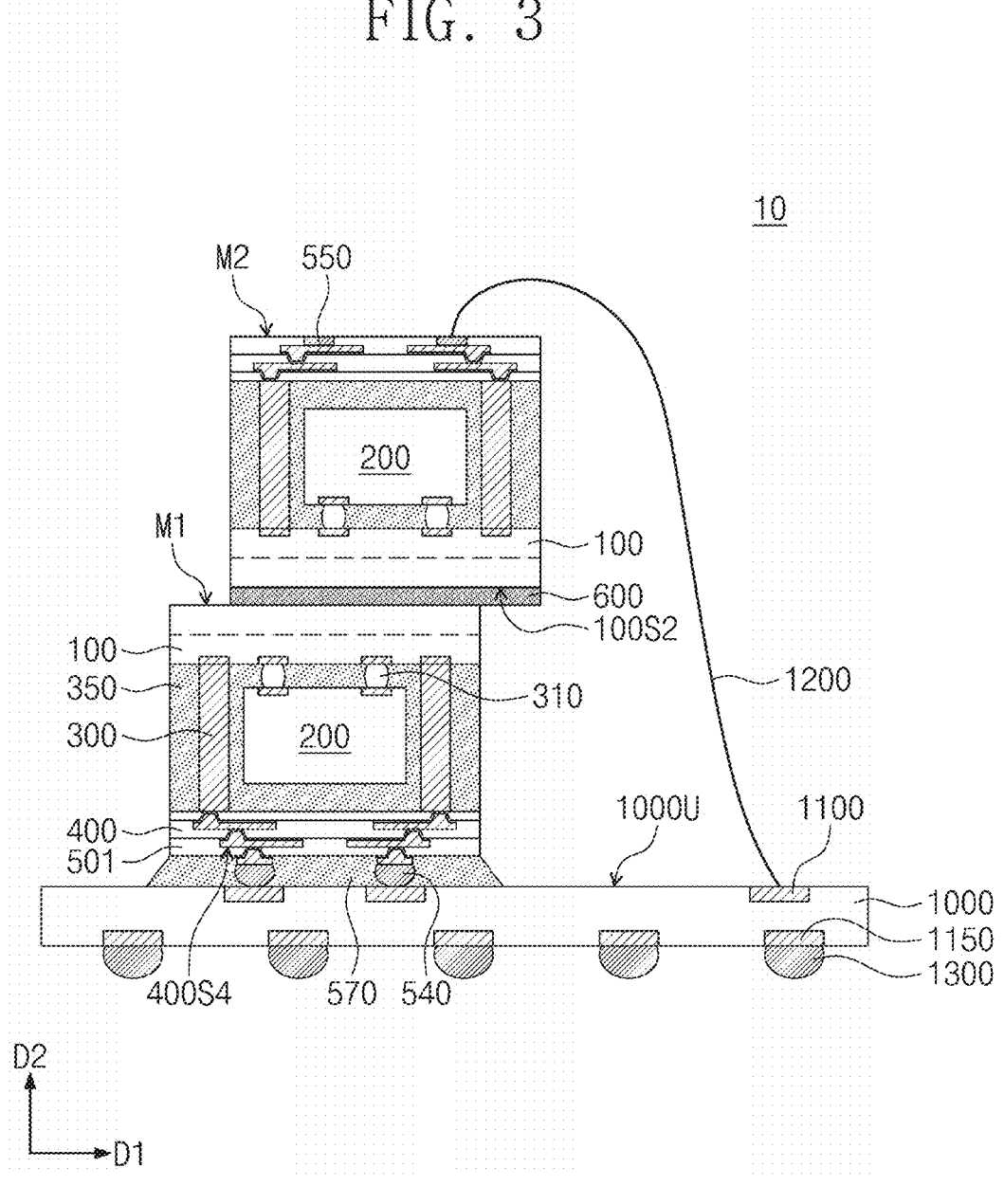
FIG. 3 is a sectional view illustrating a semiconductor package 10 according to an example embodiment of the inventive concepts.

FIG. 3 is a sectional view illustrating a semiconductor package 10 according to an example embodiment of the inventive concepts.

Referring to FIG. 3, the semiconductor package 10 may include a first semiconductor module M1, a second semiconductor module M2, a substrate 1000, an under-fill layer 570, an adhesive layer 600, and a bonding wire 1200. The first semiconductor module M1 may have substantially the same structure as the semiconductor module 1 described with reference to FIG. 1. The second semiconductor module M2 may have substantially the same structure as the semiconductor module 2 described with reference to FIG. 2.

The first semiconductor module M1 may be disposed on the substrate 1000. In an example embodiment, the substrate 1000 may be a printed circuit board (PCB). The substrate 1000 may include first substrate pads 1100 and second substrate pads 1150. The first substrate pads 1100 may be disposed on a top surface 1000U of the substrate 1000, and the second substrate pads 1150 may be disposed on a bottom surface of the substrate 1000. The first and second substrate pads 1100 and 1150 may be formed of or include at least one of conductive materials. Lower connection terminals 1300 may be disposed on the second substrate pads 1150, respectively, and may be electrically connected to outer terminals. The first and second substrate pads 1100 and 1150 may be electrically connected to each other through internal interconnection lines in the substrate 1000.

The redistribution substrate 400 may be disposed such that the fourth surface 400S4 faces the top surface 1000U of the substrate 1000. The solder balls 540 may be aligned to corresponding ones of the first substrate pads 1100, and in an example embodiment, the solder balls 540 may be coupled to the corresponding ones of the first substrate pads 1100 by a soldering process. Accordingly, the first semiconductor module M1 may be electrically connected to the substrate 1000.

The under-fill layer 570 may be disposed between the substrate 1000 and the first semiconductor module M1 and may cover the solder balls 540. The under-fill layer 570 may cover the top surface 1000U of the substrate 1000 and may fill a space between the solder balls 540. The under-fill layer 570 may be locally provided on the top surface 1000U of the substrate 1000. The under-fill layer 570 may be formed of or include an insulating polymer material (e.g., an epoxy resin).

The adhesive layer 600 may be disposed between the first semiconductor module M1 and the second semiconductor module M2. The adhesive layer 600 may have substantially the same size and shape as the second surface 100S2 of the first semiconductor chip 100 of the second semiconductor module M2. The adhesive layer 600 may attach the first semiconductor module M1 to the second semiconductor module M2.

The second semiconductor module M2 may be disposed on the adhesive layer 600. The second semiconductor module M2 may be disposed such that the second surface 100S2 of the first semiconductor chip 100 faces the substrate 1000. The second surface 100S2 of the first semiconductor chip 100 of the first semiconductor module M1 may face the second surface 100S2 of the first semiconductor chip 100 of the second semiconductor module M2, and the adhesive layer 600 may be interposed between the second surface 100S2 of the first semiconductor chip 100 of the first semiconductor module M1 and the second surface 100S2 of the first semiconductor chip 100 of the second semiconductor module M2. The bonding wire 1200 may be provided to connect the connection pads 550 of the second semiconductor module M2 to the first substrate pads 1100. The second semiconductor module M2 may be electrically connected to the substrate 1000 through the bonding wire 1200.

The semiconductor package 10 may further include a plurality of third semiconductor modules (not shown) provided on the second semiconductor module M2. The third semiconductor modules may have substantially the same structure as the semiconductor module 2 described with reference to FIG. 2. The adhesive layer 600 may be further provided between the second semiconductor module M2 and the third semiconductor modules (not shown) and between the third semiconductor modules (not shown). The bonding wire 1200 may be further provided to connect each of the third semiconductor modules (not shown) to a corresponding one of the first substrate pads 1100. Accordingly, the third semiconductor modules (not shown) may be electrically connected to the substrate 1000.

The first semiconductor module M1 may be electrically connected to the substrate 1000 through the solder balls 540, and the second semiconductor module M2 may be electrically connected to the substrate 1000 through the bonding wire 1200.

Figure 4:
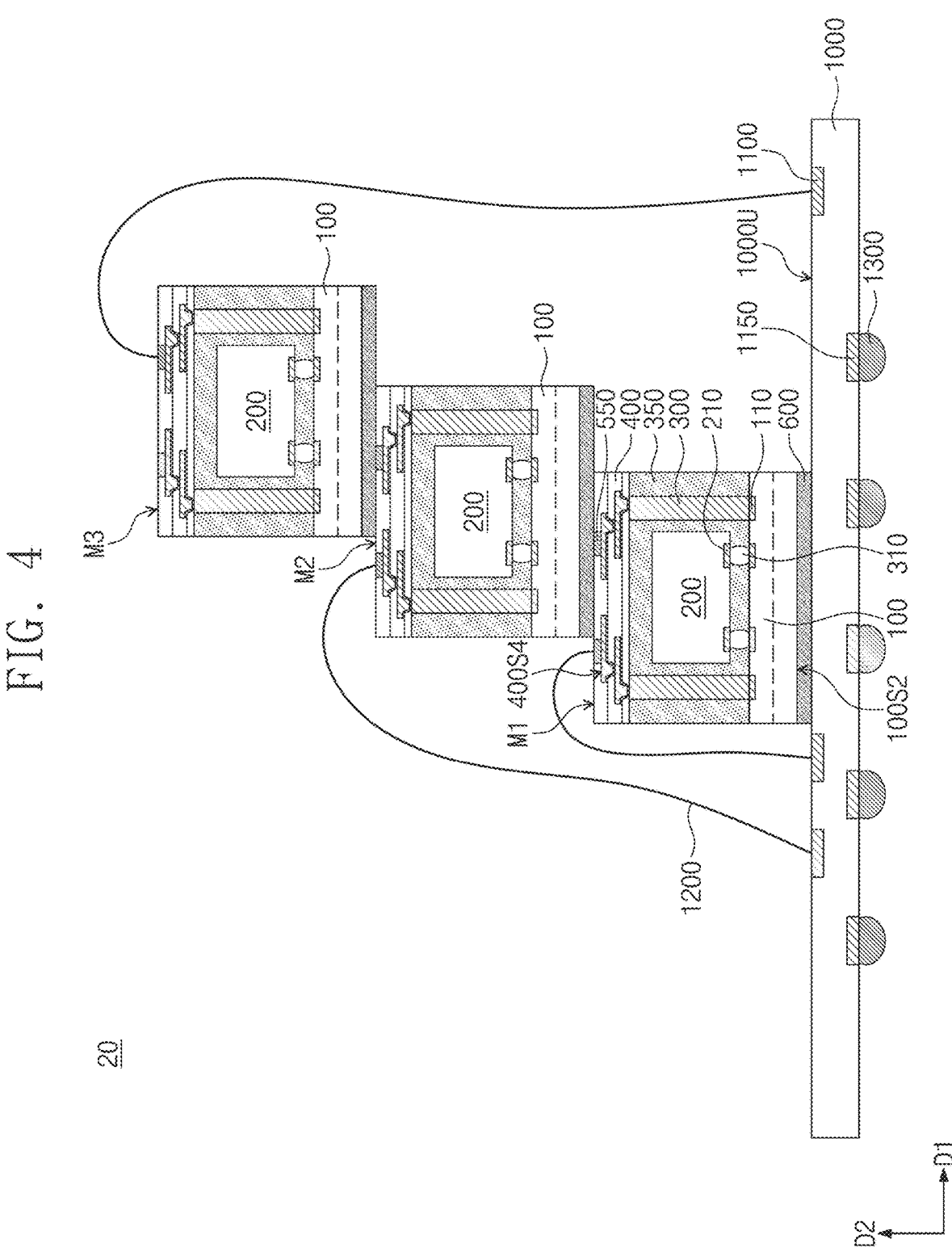
FIG. 4 is a sectional view illustrating a semiconductor package 20 according to an example embodiment of the inventive concepts.

FIG. 4 is a sectional view illustrating a semiconductor package 20 according to an example embodiment of the inventive concepts. For concise description, the description that follows will mainly refer to features different from those in the semiconductor package 10 described with reference to FIG. 3.

Referring to FIG. 4, the semiconductor package 20 may include the first semiconductor module M1, the second semiconductor module M2, a third semiconductor module M3, the substrate 1000, the adhesive layer 600, and the bonding wires 1200. The first, second, and third semiconductor modules M1, M2, and M3 may have substantially the same structure as the semiconductor module 2 described with reference to FIG. 2.

The first semiconductor module M1 may be disposed on the substrate 1000. The first semiconductor module M1 may be disposed such that the second surface 100S2 of the first semiconductor chip 100 faces the top surface 1000U of the substrate 1000. The second semiconductor module M2 may be disposed on the first semiconductor module M1. The second semiconductor module M2 may be disposed such that the second surface 100S2 of the first semiconductor chip 100S faces the fourth surface 400S4 of the redistribution substrate 400 of the first semiconductor module M1. The third semiconductor module M3 may be disposed on the second semiconductor module M2. The third semiconductor module M3 may be disposed such that the second surface 100S2 of the first semiconductor chip 100 faces the fourth surface 400S4 of the redistribution substrate 400 of the second semiconductor module M2. In other words, the first, second, and third semiconductor modules M1, M2, and M3 may be stacked on the substrate 1000 in the second direction D2. In addition, to expose connection pads of each of the semiconductor modules M1, M2, and M3, each of the second and third semiconductor modules M2 and M3 may be offset from a corresponding one of the semiconductor modules M1 and M2 thereunder in a specific direction.

The adhesive layers 600 may be respectively provided between the substrate 1000 and the first semiconductor module M1, between the first semiconductor module M1 and the second semiconductor module M2, and between the second semiconductor module M2 and the third semiconductor module M3 to attach them to each other. The adhesive layer 600 may have substantially the same shape and size as the second surface 100S2 of the first semiconductor chip 100 of each of the semiconductor modules M1, M2, and M3.

The bonding wires 1200 may be provided to connect the connection pads 550 of the first, second, and third semiconductor modules M1, M2, and M3 to corresponding ones of the first substrate pads 1100. Each of the semiconductor modules M1, M2, and M3 may be electrically connected to the substrate 1000 through the bonding wire 1200.

In an example embodiment, the number of the semiconductor modules stacked in the second direction D2 is not limited to three, and a plurality of semiconductor modules (not shown) may be further provided.

Figure 5:
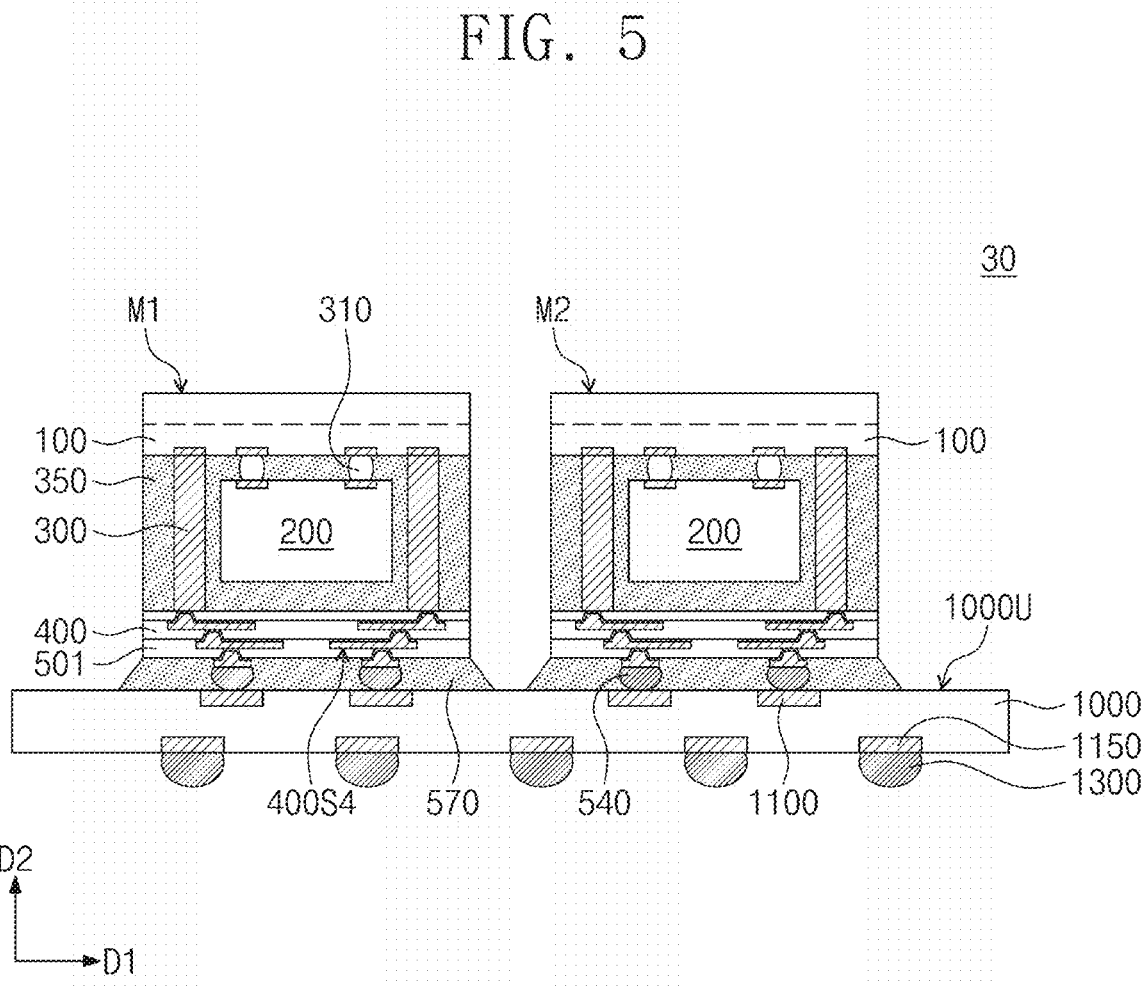
FIG. 5 is a sectional view illustrating a semiconductor package 30 according to an example embodiment of the inventive concepts.

FIG. 5 is a sectional view illustrating a semiconductor package 30 according to an example embodiment of the inventive concepts. For concise description, the description that follows will mainly refer to features different from those in the semiconductor package 10 described with reference to FIG. 3.

Referring to FIG. 5, the semiconductor package 30 may include the first semiconductor module M1, the second semiconductor module M2, the under-fill layer 570, and the substrate 1000. The first semiconductor module M1 and the second semiconductor module M2 may have substantially the same structure as the semiconductor module 1 described with reference to FIG. 1.

The first semiconductor module M1 may be disposed on the substrate 1000. The first semiconductor module M1 may be disposed to have a fourth surface 400S2 facing the top surface 1000U of the substrate 1000. The solder balls 540 of the first semiconductor module M1 may be provided to be coupled to corresponding ones of the first substrate pads 1100. Accordingly, the first semiconductor module M1 may be electrically connected to the substrate 1000.

The second semiconductor module M2 may be disposed on the substrate 1000. The second semiconductor module M2 may be spaced apart from the first semiconductor module M1 in the first direction D1. The top surface 1000U of the substrate 1000 and the fourth surface 400S4 of the redistribution substrate 400 of the second semiconductor module M2 may face each other. The solder balls 540 of the second semiconductor module M2 may be provided to be coupled to corresponding ones of the first substrate pads 1100. Accordingly, the second semiconductor module M2 may be electrically connected to the substrate 1000.

The under-fill layer 570 may be disposed between the substrate 1000 and the first semiconductor module M1 and between the substrate 1000 and the second semiconductor module M2 and may cover the solder balls 540. The under-fill layer 570 may cover the top surface 1000U of the substrate 1000 and may fill a space between the solder balls 540. The under-fill layer 570 may be locally provided on the top surface 1000U of the substrate 1000. The under-fill layer 570 may be formed of or include an insulating polymer material (e.g., an epoxy resin).

The number of the semiconductor modules, which are spaced apart from each other in the first direction D1, is not limited to two, and a plurality of semiconductor modules (not shown) may be further provided.

In the semiconductor package according to an example embodiment of the inventive concepts, a penetration electrode penetrating the semiconductor chip may not be required. Thus, it may be possible to provide a semiconductor package including semiconductor chips that are stacked in an easy and cost-effective manner. In addition, since the semiconductor chip is formed as a module and then is stacked, it may be possible to improve reliability of the semiconductor package and to reduce difficulties in performing a rework process.

FIGS. 6 to 15 are sectional views illustrating a method of fabricating a semiconductor module, according to an example embodiment of the inventive concepts. For concise description, a previously described element may be identified by the same reference number without repeating an overlapping description thereof.

Figure 6:
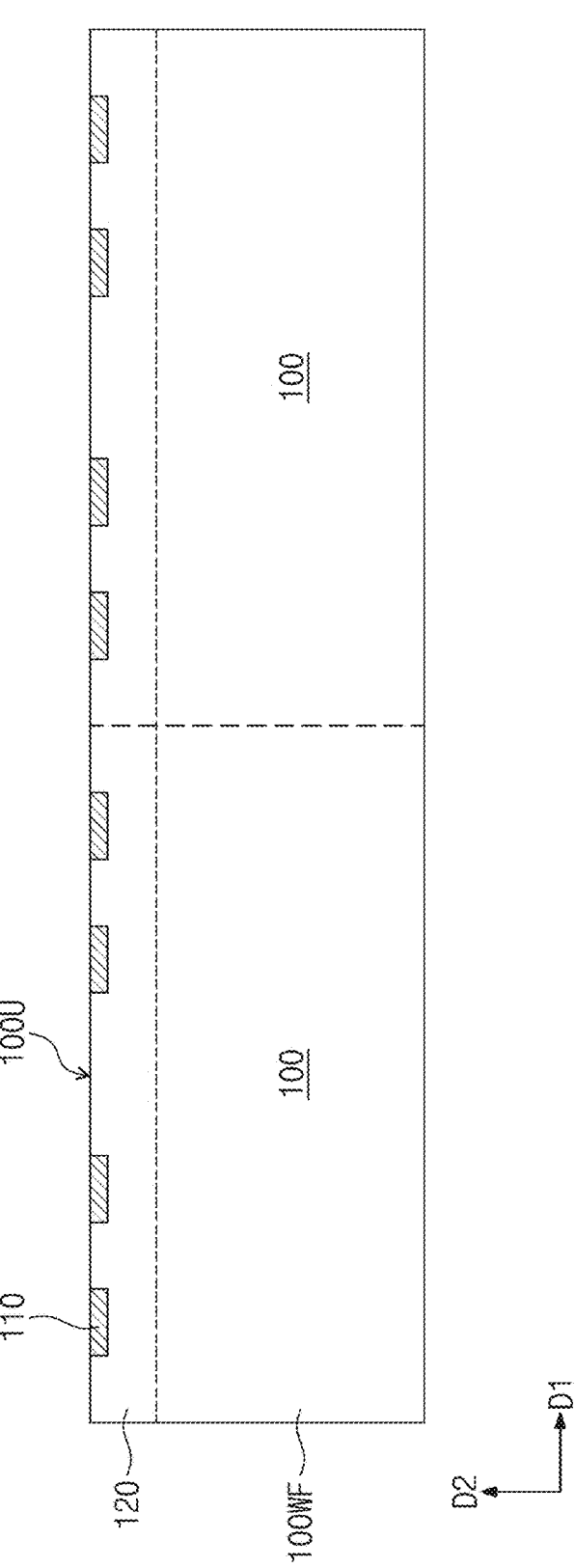

Referring to FIG. 6, a wafer 100WF including first semiconductor chips 100 may be provided. The first semiconductor chips 100 may include the first circuit layers 120, respectively, and here, the first circuit layers 120 may be disposed to be adjacent to a top surface 100U of the wafer 100WF. The first circuit layers 120 may include integrated circuits. The first semiconductor chips 100 may include the first chip pads 110, and in an embodiment, the first chip pads 110 may be disposed adjacent to the top surface 100U of the wafer 100WF. The first chip pads 110 may be electrically connected to the first circuit layers 120.

Figure 7:
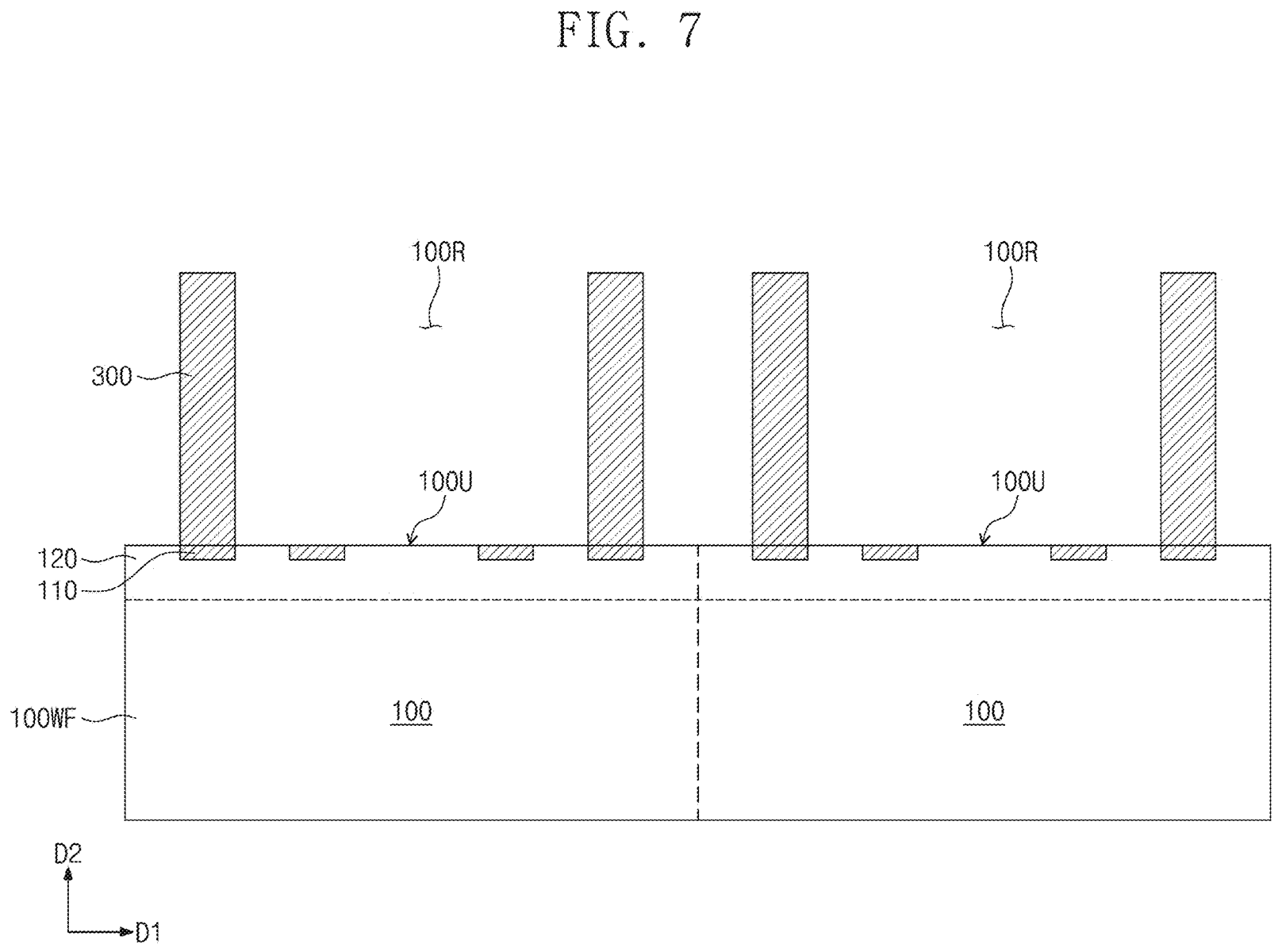

Referring to FIG. 7, a plurality of the conductive pillars 300 may be formed on the top surface 100U of the wafer 100WF. Chip mounting regions 100R may be previously defined on the top surface 100U of the wafer 100WF, and conductive pillars 3000 may be formed on the top surface 100U of the wafer 100WF excluding the chip mounting regions 100R. In an example embodiment, the conductive pillars 300 may be formed using an electroplating process. As an example, the formation of the conductive pillars 300 may include forming a photoresist pattern, which has openings exposing regions to be provided with the conductive pillars 300, on the top surface 100U of the wafer 100WF, forming a seed layer on the photoresist pattern, and performing the electroplating process on the seed layer to form the conductive pillars 300. The photoresist pattern may be removed, after the formation of the conductive pillars 300.

Figure 8:
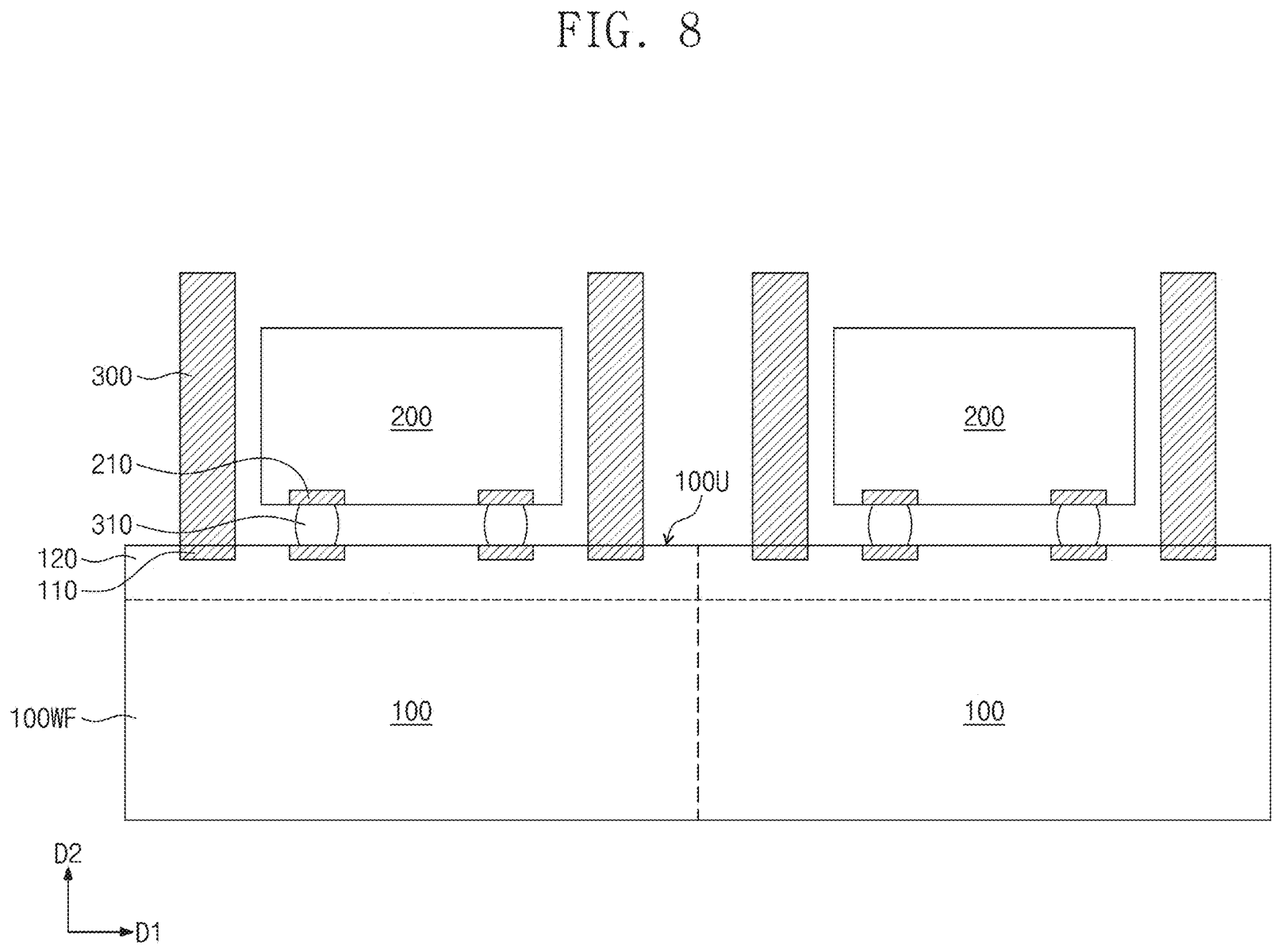

Referring to FIG. 8, the connecting portions 310 may be formed on the top surface 100U of the wafer 100WF and in the chip mounting regions 100R. The connecting portions 310 may be respectively formed on and connected to corresponding ones of the first chip pads 110.

The second semiconductor chips 200 may be provided in the chip mounting regions 100R, respectively. Each of the second semiconductor chips 200 may include the second chip pads 210, and the second chip pads 210 may be disposed to be adjacent to a surface of each of the second semiconductor chips 200. Each of the second semiconductor chips 200 may be provided on the top surface 100U of the wafer 100WF such that the second chip pads 210 are in contact with corresponding ones of the connecting portions 310, respectively.

Figure 9:
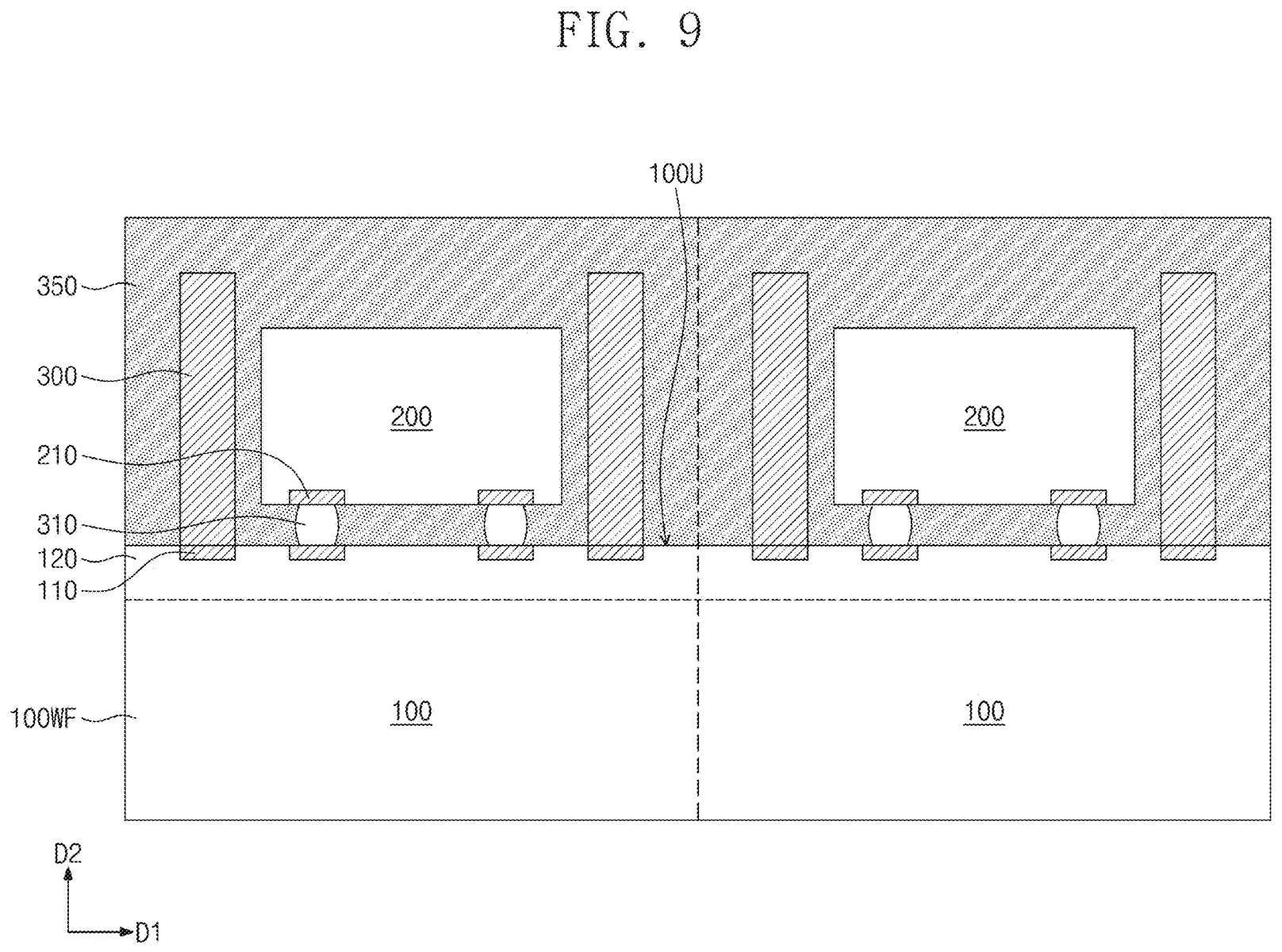

Referring to FIG. 9, the mold layer 350 may be formed on the top surface 100U of the wafer 100WF to cover the second semiconductor chips 200 and the conductive pillars 300. In an example embodiment, the mold layer 350 may be extended into a region between each of the second semiconductor chips 200 and the wafer 100WF to cover the connecting portions 310.

Figure 10:
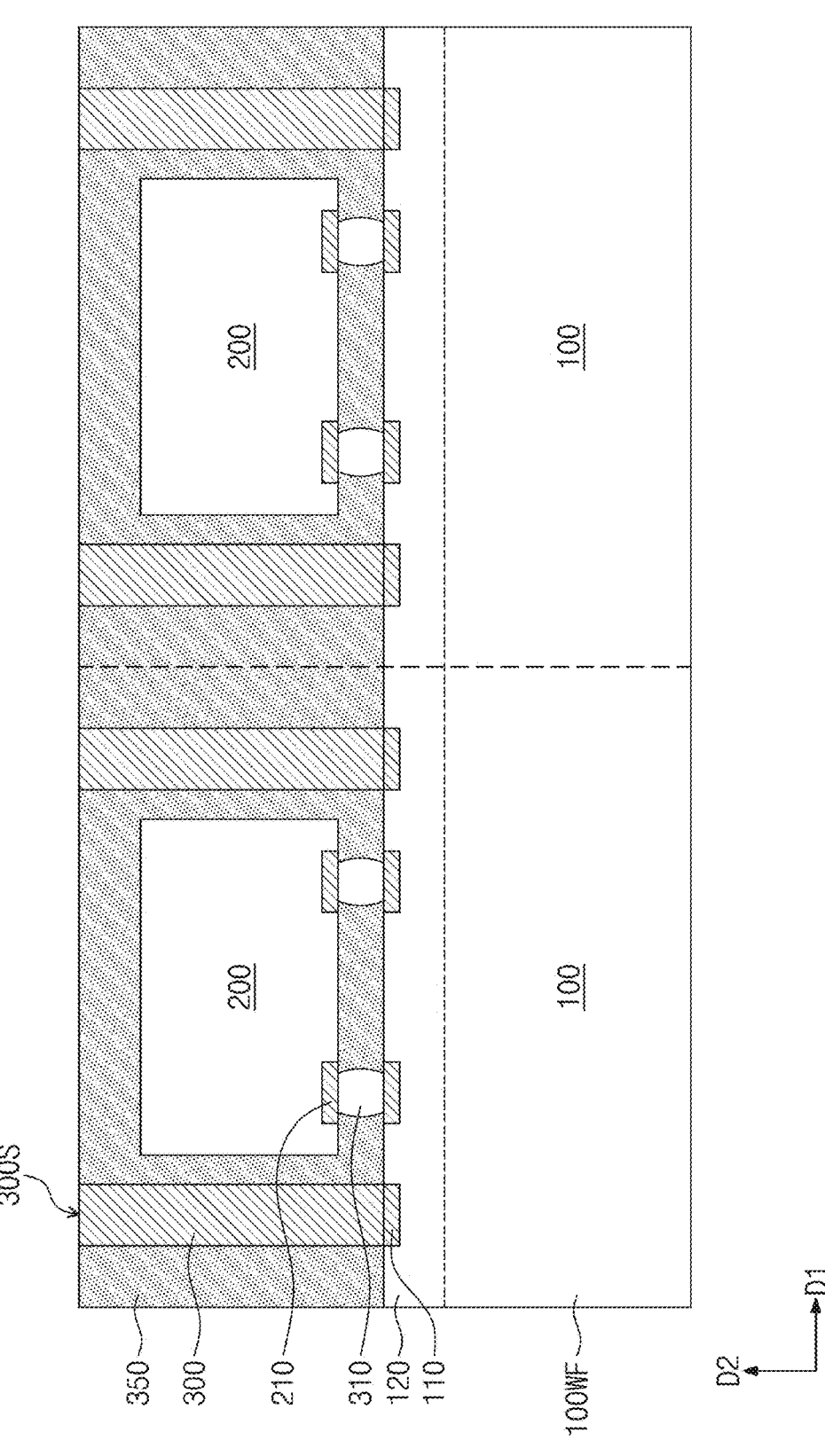

Referring to FIG. 10, a grinding process may be performed on the mold layer 350 to remove an upper portion of the mold layer 350. As a result of the grinding process, the top surfaces 300S of the conductive pillars 300 may be exposed to the outside. In an example embodiment, a surface of each of the second semiconductor chips 200 may be exposed to the outside by the grinding process. In another example embodiment, each of the second semiconductor chips 200 may not be exposed to the outside by the grinding process and may be covered with the mold layer 350.

Figure 11:
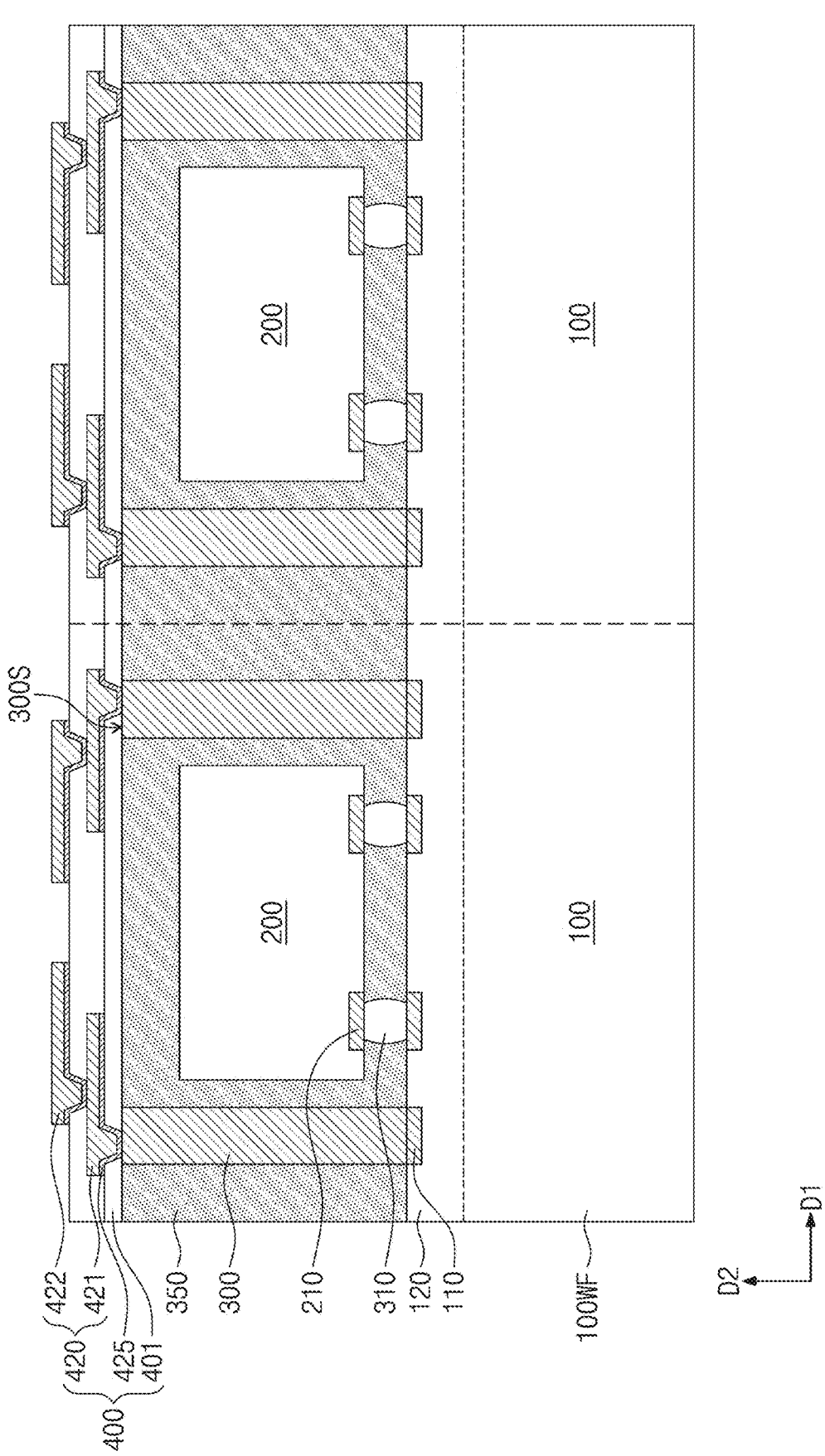

Referring to FIG. 11, the redistribution substrate 400 may be formed on the top surface of the mold layer 350. For example, the redistribution substrate 400 may be formed by a patterning process and an electroplating process. The redistribution substrate 400 may be formed such that the first sub-redistribution patterns 421 are disposed on the top surfaces 300S of the conductive pillars 300.

Figure 12:
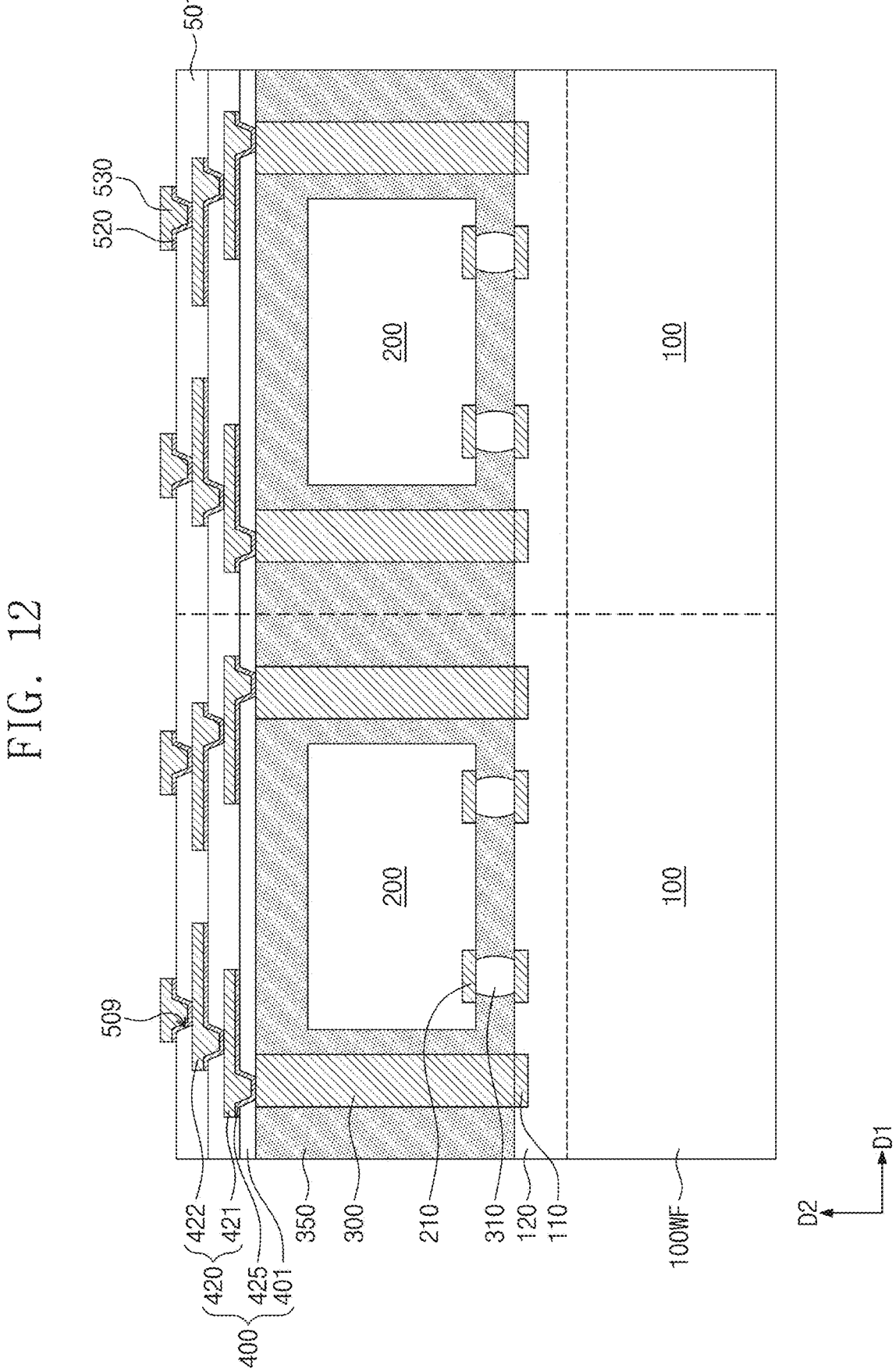

Referring to FIG. 12, the protection layer 501 may be formed on the redistribution substrate 400. The protection layer 501 may be formed to cover the second sub-redistribution patterns 422 and to expose a portion of each of the second sub-redistribution patterns 422. For example, the protection layer 501 may be formed by a photolithography process or a patterning process. The under-bump patterns 530 may be formed on the second sub-redistribution patterns 422 and the protection layer 501. In an example embodiment, the under-bump patterns 530 may be formed by an electroplating process.

Figure 13:
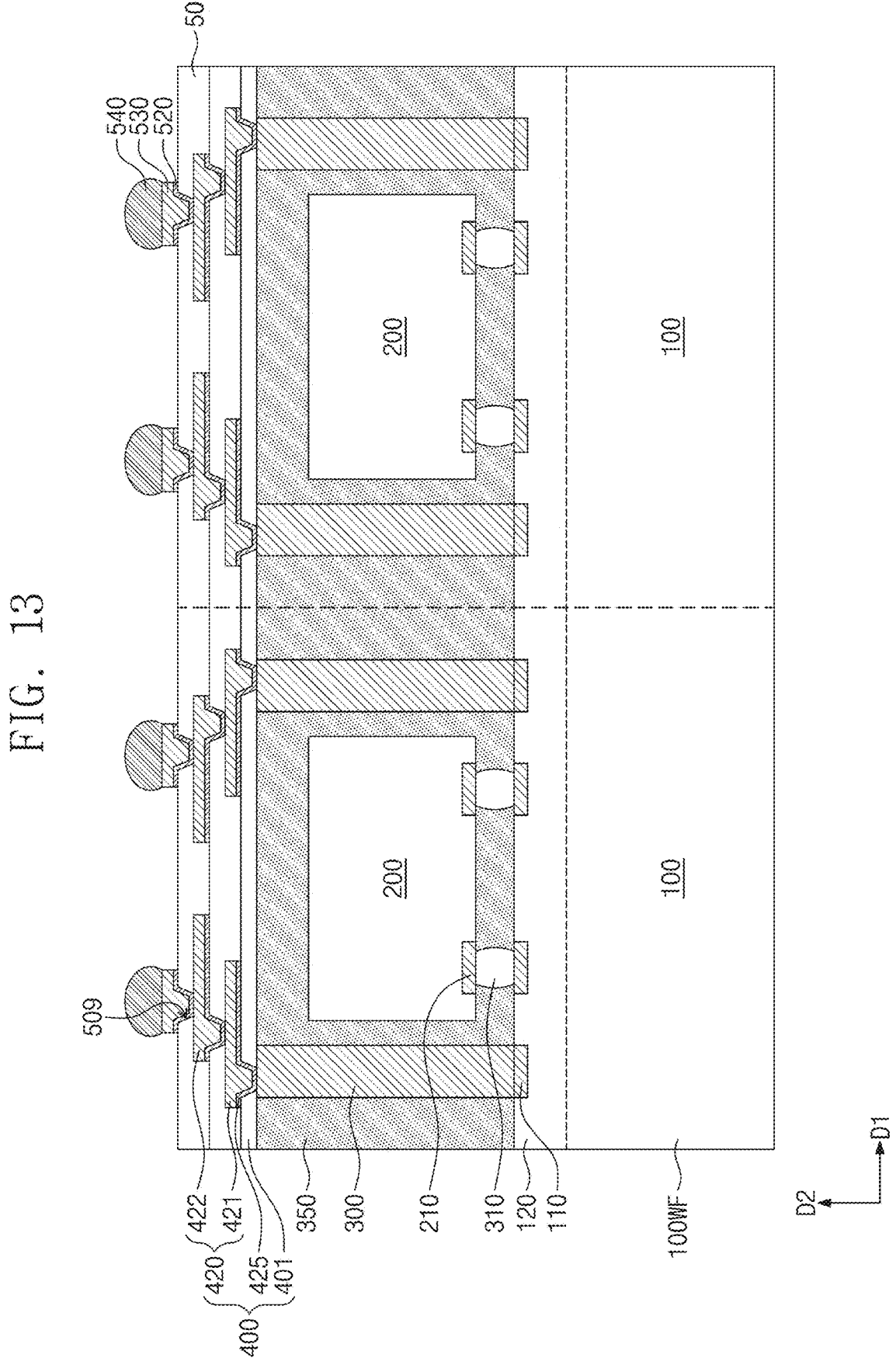

Referring to FIG. 13, the solder balls 540 may be formed on the under-bump patterns 530, respectively. A stack SS may be formed by the afore-described processes.

Figure 14:
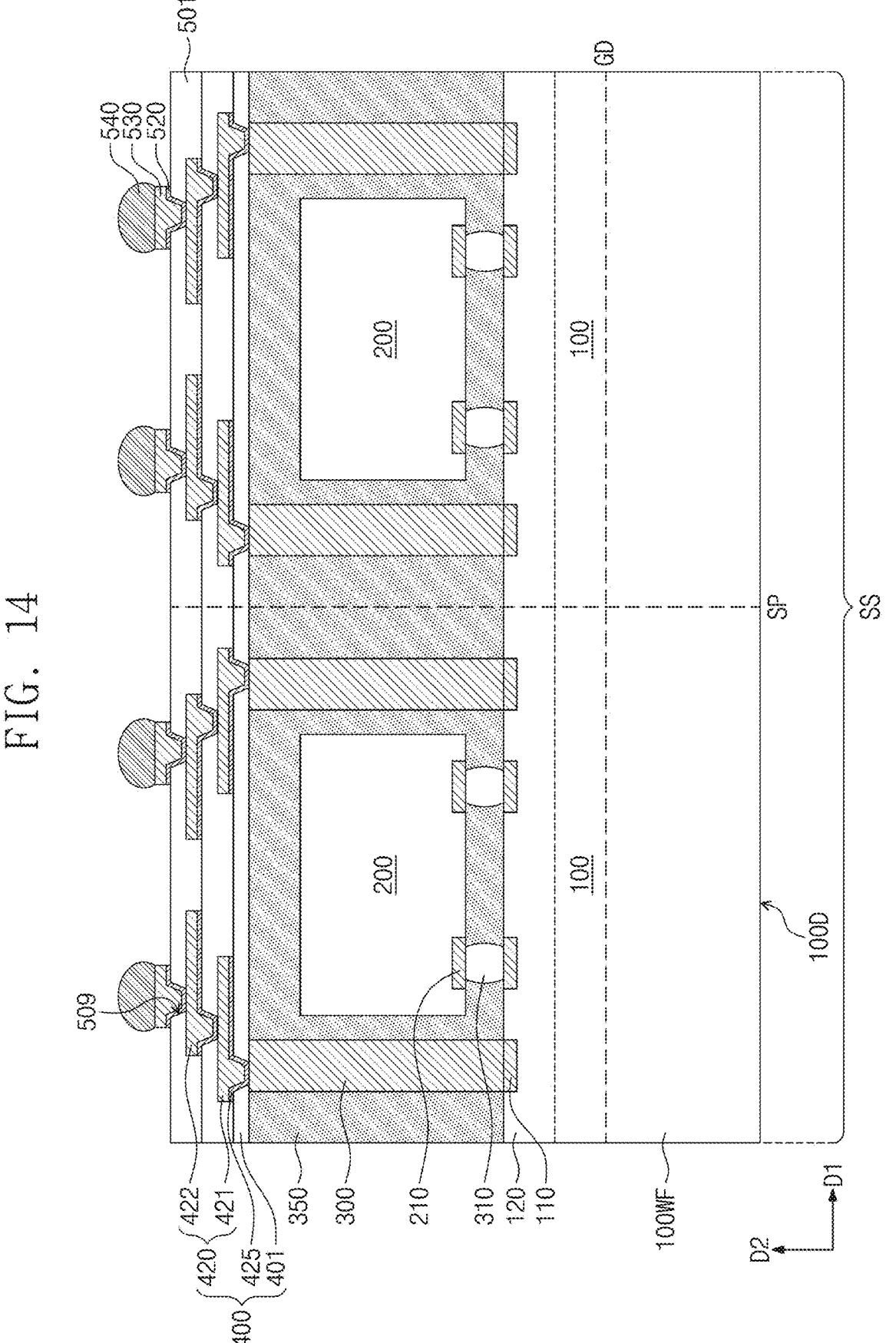
Figure 15:
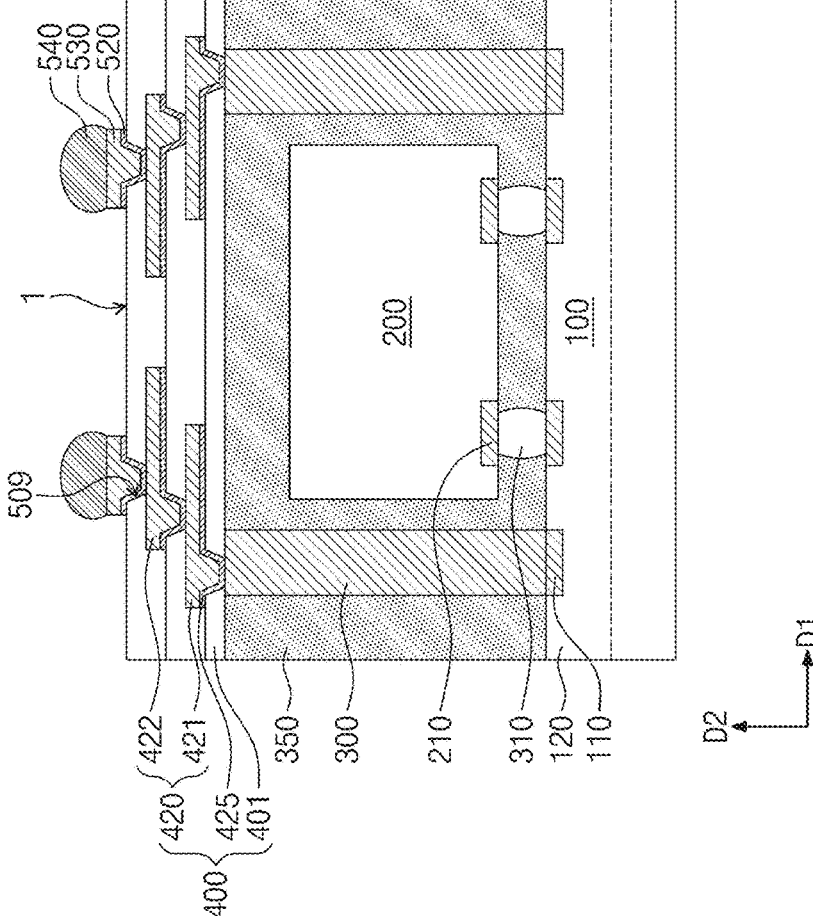

Referring to FIGS. 14 and 15, a bottom surface 100D of the wafer 100WF may be ground by a grinding process GD. After the grinding process, the stack SS may be divided into a plurality of the semiconductor modules 1 by a sawing process SP. Accordingly, the fabrication of the semiconductor module 1 may be finished.

Figure 16:
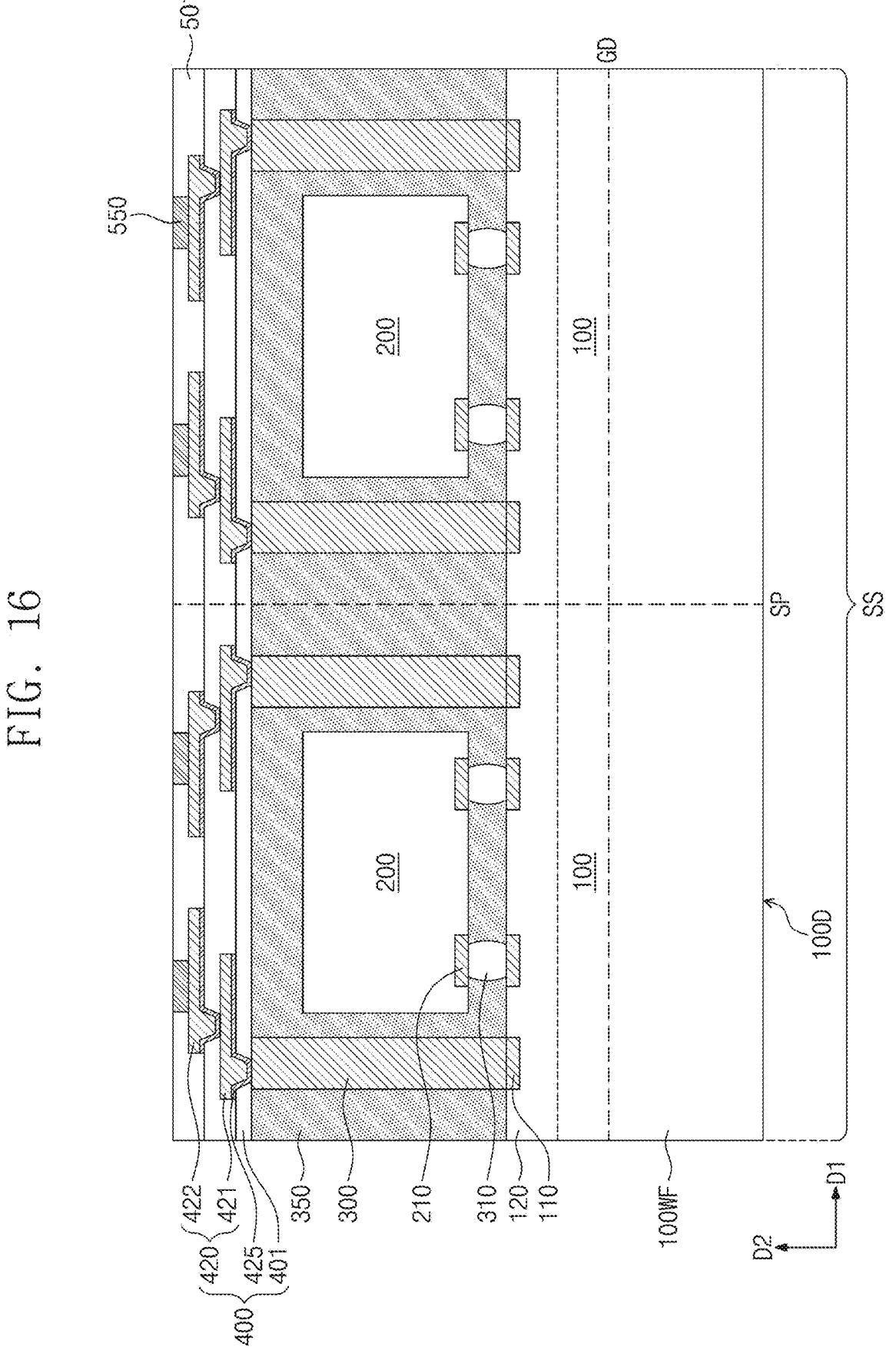
FIGS. 16 and 17 are sectional views illustrating a method of fabricating a semiconductor module, according to an example embodiment of the inventive concept.
Figure 17:
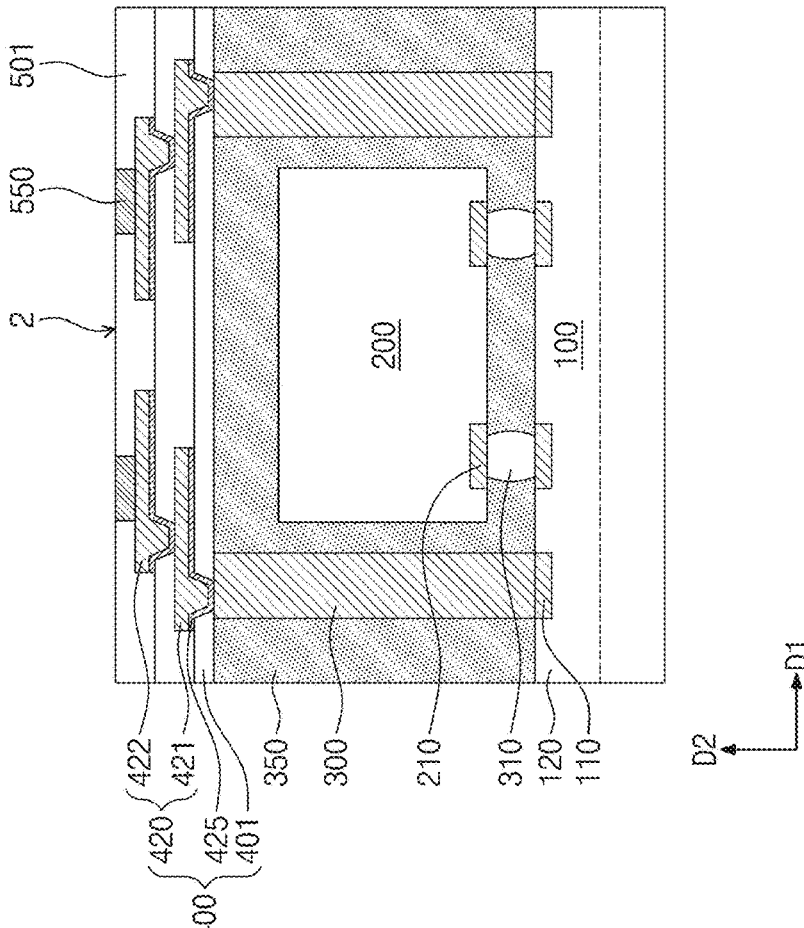

FIGS. 16 and 17 are sectional views illustrating a method of fabricating a semiconductor module, according to an example embodiment of the inventive concepts. A fabrication process may be performed in the same or substantially the same manner as the fabrication method described with reference to FIGS. 6 to 11, and a process to be performed thereafter will be described in more detail with reference to FIGS. 16 and 17. For concise description, a previously described element may be identified by the same reference number without repeating an overlapping description thereof.

Referring to FIG. 16, the connection pads 550 may be formed on the second sub-redistribution patterns 422 and in the protection layer 501. In an example embodiment, the formation of the connection pads 550 may include performing an electroplating process. The stack SS may be formed by the afore-described processes.

Referring to FIG. 17, the stack SS may be divided into a plurality of semiconductor modules 2 by the grinding process GD and the sawing process SP. Accordingly, the fabrication of the semiconductor module 2 may be finished.

Referring back to FIGS. 3 to 5, a semiconductor package may be fabricated by connecting the semiconductor modules 1 and 2, which are fabricated by the fabrication method described with reference to FIGS. 6 to 17, to the substrate 1000.

According to an example embodiment of the inventive concepts, a semiconductor package may be provided to include a semiconductor module, which is disposed on and is connected to a substrate. In some example embodiments, a semiconductor chip may not be directly mounted on the substrate; for example, after the formation of the semiconductor module, the semiconductor chip may be mounted on the substrate. Accordingly, it may be possible to easily stack the semiconductor chips and to reduce a size of the semiconductor package.

In addition, since the stacking process is performed without using a penetration electrode, it may be possible to provide a cost-effective semiconductor package.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While some example embodiments of the inventive concepts have been particularly shown and described, it will be understood by one of ordinary skill in the art that variations in form and detail may be made therein without departing from the scope of the inventive concepts.

What is claimed is:

1. A semiconductor package comprising at least one semiconductor module on a substrate, the semiconductor module comprising:
   a first semiconductor chip having a first surface and a second surface, the first surface opposite to the second surface;
   a second semiconductor chip on the first surface of the first semiconductor chip, the second semiconductor chip electrically connected to the first surface;
   a plurality of conductive pillars on the first surface of the first semiconductor chip, the plurality of conductive pillars horizontally spaced apart from the second semiconductor chip; and
   a redistribution substrate on the second semiconductor chip and the plurality of conductive pillars, the redistribution substrate having a third surface and a fourth surface, the third surface opposite to the fourth surface, the third surface of the redistribution substrate facing the first surface of the first semiconductor chip, the plurality of conductive pillars electrically connected to the first surface of the first semiconductor chip and the third surface of the redistribution substrate, and the fourth surface of the redistribution substrate electrically connected to the substrate of the semiconductor package, wherein the semiconductor module comprises a mold layer between the first surface of the first semiconductor chip and the third surface of the redistribution substrate, and a side surface of the redistribution substrate and a side surface of the first semiconductor chip are not covered by the mold layer and are exposed to an outside of the semiconductor package.

2. The semiconductor package of claim 1, further comprising solder balls on the fourth surface of the redistribution substrate, wherein the fourth surface of the redistribution substrate faces the substrate of the semiconductor package, and the fourth surface of the redistribution substrate is electrically connected to the substrate of the semiconductor package through the solder balls.

3. The semiconductor package of claim 2, wherein the semiconductor module is a first semiconductor module, the semiconductor package further comprises a second semiconductor module, the second semiconductor module stacked on the first semiconductor module in a direction perpendicular to the first surface, and the second semiconductor module is electrically connected to the substrate through a bonding wire.

4. The semiconductor package of claim 3, wherein the second semiconductor module is one of multiple second semiconductor modules.

5. The semiconductor package of claim 1, wherein the second surface of the first semiconductor chip faces the substrate of the semiconductor package, and the semiconductor package further comprises:

an adhesive layer between the second surface of the first semiconductor chip and the substrate;

a connection pad on the fourth surface of the redistribution substrate; and a bonding wire electrically connecting the connection pad to the substrate.

6. The semiconductor package of claim 5, wherein the semiconductor module is a first semiconductor module, the semiconductor package further comprises a second semiconductor module, the second semiconductor module stacked on the first semiconductor module in a direction perpendicular to the first surface, and the second semiconductor module is electrically connected to the substrate through a bonding wire.

7. The semiconductor package of claim 2, further comprising an under-fill layer between the fourth surface of the redistribution substrate and the substrate, wherein the under-fill layer fills a space between the solder balls.

8. The semiconductor package of claim 2, wherein the semiconductor module is a first semiconductor module, the semiconductor package further comprises a plurality of second semiconductor modules, the plurality of second semiconductor modules horizontally spaced apart from the first semiconductor module, and the second semiconductor modules and the substrate are electrically connected to each other through the solder balls.

9. The semiconductor package of claim 1, wherein each of the first and second semiconductor chips has a width in a first direction parallel to the first surface, and the width of the first semiconductor chip is larger than the width of the second semiconductor chip.

10. The semiconductor package of claim 1, wherein each of the second semiconductor chip and the conductive pillars has a height in a second direction perpendicular to the first surface, and the height of each of the conductive pillars is equal to or larger than the height of the second semiconductor chip.

11. The semiconductor package of claim 1, wherein the first semiconductor chip comprises first chip pads adjacent to the first surface, the second semiconductor chip comprises second chip pads, and the second chip pads are connected to corresponding ones of the first chip pads, and the conductive pillars are connected to corresponding ones of the first chip pads.

12. A semiconductor package, comprising: a substrate;

a first semiconductor module on the substrate;

a bonding wire;

and a second semiconductor module on the first semiconductor module, each of the first and second semiconductor modules comprising a first semiconductor chip having a first surface and a second surface, the first surface opposite to the second surface, a second semiconductor chip on the first surface of the first semiconductor chip, the second semiconductor chip electrically connected to the first surface, a plurality of conductive pillars on the first surface of the first semiconductor chip, the plurality of conductive pillars horizontally spaced apart from the second semiconductor chip, and a redistribution substrate on the second semiconductor chip and the plurality of conductive pillars, wherein the redistribution substrate has a third surface and a fourth surface, the third surface opposite to the fourth surface, the third surface of the redistribution substrate faces the first surface of the first semiconductor chip, the plurality of conductive pillars are electrically connected to the first surface of the first semiconductor chip and the third surface of the redistribution substrate, the first semiconductor module comprises solder balls on the fourth surface of the redistribution substrate, the fourth surface of the redistribution substrate faces the substrate of the semiconductor package, the first semiconductor module is electrically connected to the substrate through the solder balls, the second semiconductor module comprises a connection pad on the fourth surface of the redistribution substrate, the second surface of the first semiconductor chip faces the substrate of the semiconductor package, and the bonding wire electrically connects the connection pad of the second semiconductor module to the substrate of the semiconductor package.

13. The semiconductor package of claim 12, wherein the first and second semiconductor modules further comprise a mold layer between the first surface of the first semiconductor chip and the third surface of the redistribution substrate, and a side surface of the redistribution substrate and a side surface of the first semiconductor chip are not covered by the mold layer and are exposed.

14. The semiconductor package of claim 12, further comprising an adhesive layer between the first semiconductor module and the second semiconductor module.

15. A method of fabricating a semiconductor package, the method comprising:

preparing a wafer including a plurality of first semiconductor chips;

forming a plurality of conductive pillars on a top surface of the wafer, the conductive pillars electrically connected to the plurality of first semiconductor chips;

mounting a plurality of second semiconductor chips on the wafer;

forming a mold layer on the wafer to cover the second semiconductor chips;

forming a redistribution substrate on a top surface of the mold layer and top surfaces of the conductive pillars;

performing a sawing process on the wafer to form a plurality of semiconductor modules;

and stacking the semiconductor modules on a substrate, the semiconductor modules electrically connected to the substrate.

16. The method of claim 15, wherein the conductive pillars are horizontally spaced apart from the second semiconductor chips.

17. The method of claim 15, wherein each of the semiconductor modules comprises a corresponding one of the plurality of first semiconductor chips and a corresponding one of the plurality of second semiconductor chips, and the corresponding one of the first semiconductor chips and the corresponding one of the second semiconductor chips are electrically connected to each other.

18. The method of claim 15, further comprising forming a solder ball or a connection pad on the redistribution substrate, wherein each of the semiconductor modules is electrically connected to the substrate through the solder ball or the connection pad.

19. The method of claim 15, further comprising performing a grinding process on a bottom surface of the wafer, before the performing of the sawing process.

* * * * *